United States Patent
Cibulsky et al.

[19]

[11] Patent Number: 5,759,427
[45] Date of Patent: Jun. 2, 1998

[54] METHOD AND APPARATUS FOR POLISHING METAL SURFACES

[75] Inventors: Edward Cibulsky, Endwell; Gerald Andrew Kiballa, Owego; Voya Rista Markovich, Endwell, all of N.Y.; Gary Leigh Newman, Little Meadows, Pa.; John Francis Prikazsky, Binghamton; Michael Wozniak, Vestal, both of N.Y.

[73] Assignee: International Business Machines Corporation, Armonk, N.Y.

[21] Appl. No.: 704,193

[22] Filed: Aug. 28, 1996

[51] Int. Cl.⁶ .................. C23F 1/02; C23F 1/44; C23F 1/08; H05K 3/06
[52] U.S. Cl. .................. 216/91; 216/92; 216/105; 216/106; 438/691; 438/748; 156/345
[58] Field of Search .................. 216/91, 92, 105, 216/106; 438/691, 748; 156/345

[56] References Cited

U.S. PATENT DOCUMENTS

| | | | |
|---|---|---|---|
| 4,250,588 | 2/1981 | Cook et al. | 15/77 |
| 4,269,138 | 5/1981 | Dinella et al. | 118/115 |
| 4,438,795 | 3/1984 | Plough | 144/373 |
| 4,944,836 | 7/1990 | Beyer et al. | 156/645 |
| 4,964,365 | 10/1990 | D'Amato | 118/419 |
| 5,128,010 | 7/1992 | Ye | 204/212 |
| 5,232,501 | 8/1993 | Pender et al. | 118/300 |
| 5,312,887 | 5/1994 | Papathomas | 528/67 |
| 5,335,681 | 8/1994 | Schmid | 134/64 |
| 5,348,615 | 9/1994 | Gupta | 156/653 |
| 5,399,528 | 3/1995 | Leibovitz et al. | 437/195 |

FOREIGN PATENT DOCUMENTS

| | | |
|---|---|---|
| 7-183518 | 7/1995 | Japan. |
| 7-230973 A | 8/1995 | Japan. |

OTHER PUBLICATIONS

"Planarization of Films Used in IC Fabrication by Laser-Induced Chemical Etching," C.J. Hendricks, IBM Technical Disclosure Bulletin, vol. 26, No. 10B, Mar. 1984.

*Primary Examiner*—John Kight
*Assistant Examiner*—Everett White
*Attorney, Agent, or Firm*—Calfee, Halter & Griswold LLP

[57] ABSTRACT

A technique for chemically planarizing an exposed surface of metal on a substrate to a pre-determined thickness is provided. The substrate has an exposed metal surface such as copper circuitry on a dielectric substrate which is to be planarized. Typically, this will be circuitization extending above a photoresist layer. A planarizing head is rotated against the substrate, with the planarizing head in contact with the metal surface on the substrate. A chemical etchant, essentially free of abrasive material, is continuously supplied to the interface between the metal surface and the planarizing head. The planarizing continues until a predetermined thickness of the metal has been reached. In circuit board manufacturing, this will form a surface co-planar with the photoresist. In some instances where significant height reduction is required, thus requiring significant metal removal, several passes of the substrate may be required or a device with multiple heads may be used. On all but the last pass or last head, the planarizing head may include a film of polyester impregnated with very fine grit, such as 15μ or less silicon carbide (SiC). However, on the final pass or head, a relatively hard surface roll, e.g., rubber, free of added grit, is used to ensure a planar surface free of gouges.

24 Claims, 5 Drawing Sheets

METHOD AND APPARATUS FOR POLISHING METAL SURFACES

RELATED APPLICATION

Application Ser. No. 08/495,277, filed Jun. 27, 1995, entitled "Method of Producing Find-Line Circuit boards Using Chemical Polishing.

FIELD OF THE INVENTION

This invention relates generally to the polishing of metal surfaces on substrates, and more particularly to the planarizing of metal circuitry on circuit boards and the like.

BACKGROUND INFORMATION

There are several different methods of plating and creating printed circuit lines on substrates such as circuit boards and circuit cards which are presently in use. Of these, additive panel plating is utilized to control both line height and line width. However, this method is costly and time-consuming. The above disclosed related application describes a method of producing fine-line circuit boards using chemical polishing. As disclosed therein, the printed circuit board is produced from an initial substrate board coated with a resist layer. The resist layer is patterned according to a circuit mask that defines circuit paths. The pattern resist layer is then selectively removed from the board in the desired circuit paths, and a conductive material is deposited on the board in the areas where the resist was removed as defined by the circuit mask. The conductive material is deposited so that the height of the conductive material relative to the substrate board equals or exceeds the height of the resist layer relative to the substrate board. In a first etching step, a low reactive solution is applied over the conductive material and slowly dissolves it by first forming a film layer. Mechanical contact is then used to remove this film layer on any surface above the resist layer. The removal of the thin film layer allows a new conductive material surface layer to be exposed to the solution, and a new film layer to be formed. This process continues until the height of the resist layer is reached. At this point, when contact with the conductive material cannot be made without contacting the resist layer, a final film layer is formed. This final film layer then becomes a barrier to the low reactive solution and, in fact, on any area that is below the resist layer, such as a plated through hole. In this way, no abrasive materials are used in ensuring that the height of the conduct line will be substantially uniform and will conform to substrate undulations and surface irregularities. Conductive line width control is defined by the developed resist image. Circuit boards are then produced so as to have uniform height and precise width, even with organic flexible composition substrates. As taught in the above application, the relative height of the conductive material is determined by viewing a section of the board under an optical magnifying glass, such as a microscope, to determine when the relative heights are the same. As disclosed therein, the etching solution is applied, allowed to react and form a barrier, then removed. Then, a new solution is applied, the barrier is formed, and the barrier is removed. This process is repeated until an essentially planarized surface of copper circuitry is obtained.

While this technique is quite effective in producing a good planarized surface, nevertheless, it is essentially a batch process, as opposed to a continuous process, and requires iterative repetition of the forming and removing of the barrier and checking the height. This is time-consuming and requires significant manual operator involvement with significant operator judgment involved. Thus, while this process is effective, it is somewhat slow, especially if a large reduction in height of the circuit lines is required. Therefore it is an object of the present invention to provide an improved process for planarizing metal surfaces on a substrate material.

SUMMARY OF THE INVENTION

A technique for chemically planarizing an exposed surface of metal on a substrate to a pre-determined thickness is provided. The substrate has an exposed metal surface such as copper thereon which is to be planarized. Typically this will be circuitization extending above a photo resist layer. A planarizing head is provided which is continuously moving with respect to the substrate, with the planarizing head in contact with the metal surface on the substrate. A chemical etchant, essentially free of abrasive material, is continuously supplied to the interface between the metal surface and the planarizing head. The planarizing continues until a predetermined thickness of the metal has been reached. In circuit board manufacturing this will form a surface coplanar with the photo resist. In some instances where significant height reduction is required, thus requiring significant metal removal, several passes of the substrate may be required or a device with multiple heads may be used. On all but the last pass or last head, the planarizing head may include a film having a layer of very fine grit embedded therein, such as 15μ or less silicon carbide (SiC). However, on the final pass or head, a relatively hard surface roll, e.g. rubber, free of added grit, is used to ensure a planar surface free of gouges.

DESCRIPTION OF THE PREFERRED EMBODIMENT

Figure 1:
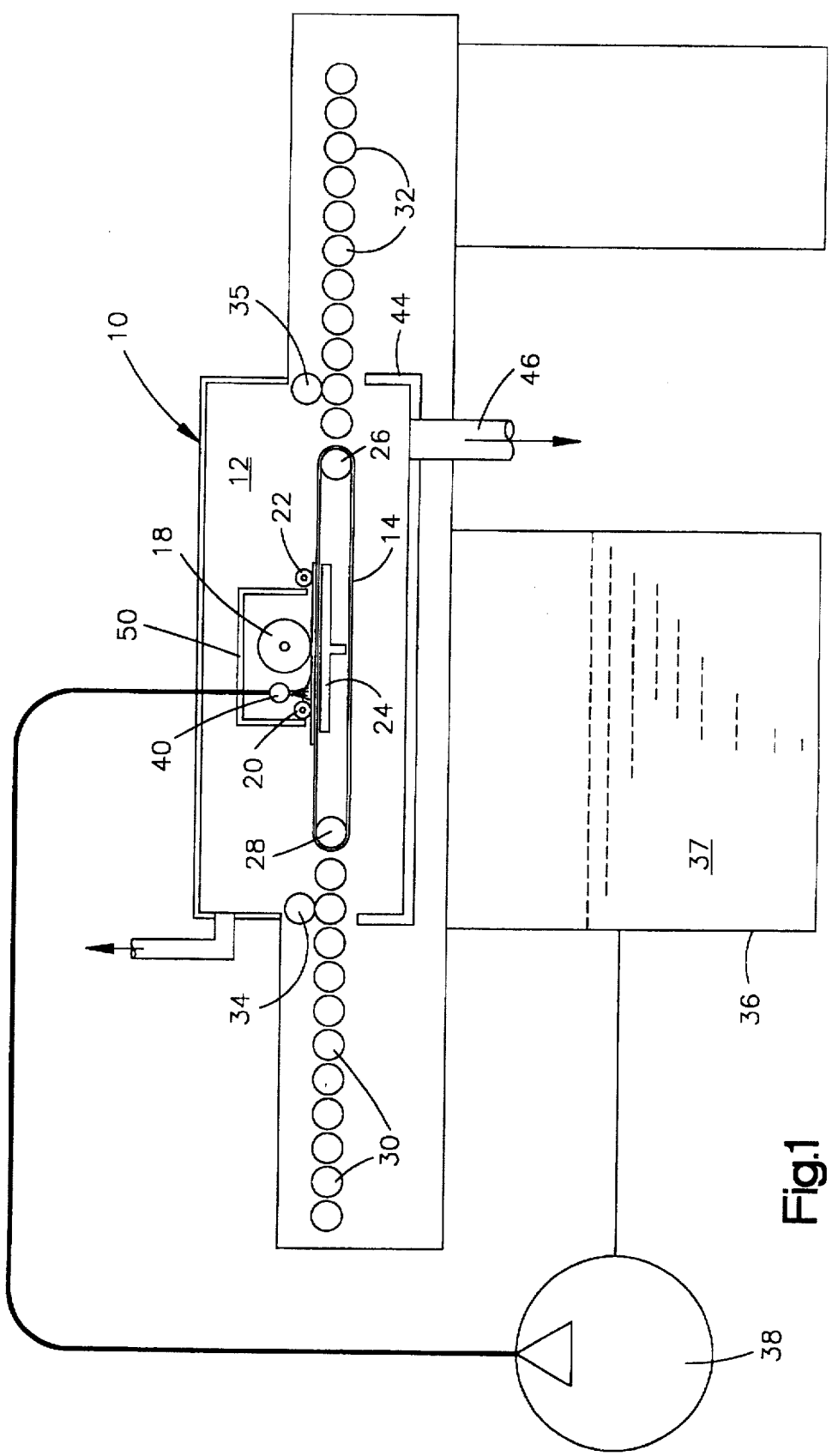
FIG. 1 is a side elevational view somewhat diagrammatic, with parts broken away for clarity, of a planarizing device according to this invention.
Figure 2:
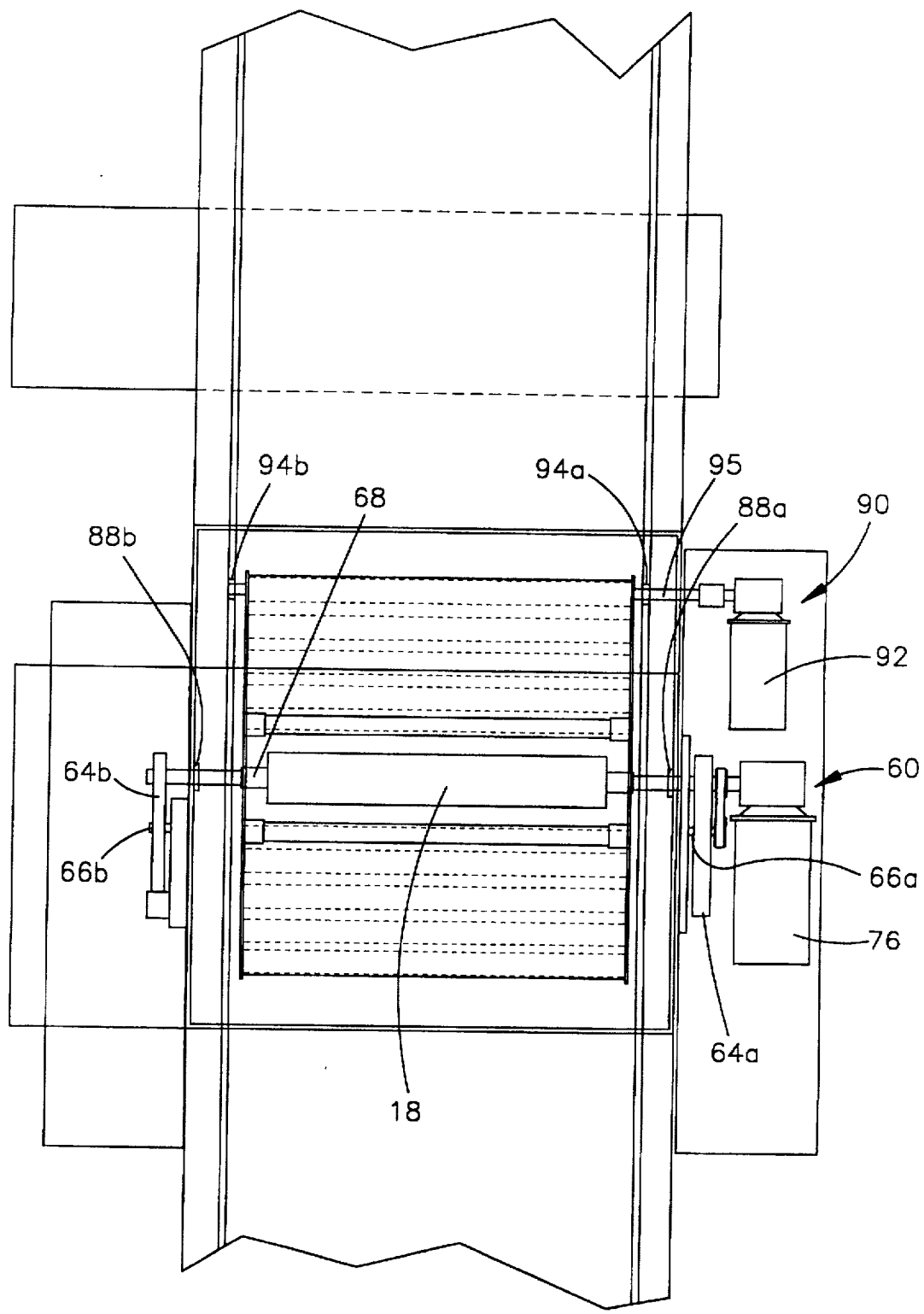
FIG. 2 is a top plan view of the device of this invention, with parts broken away for clarity, in an enlarged scale from FIG. 1.
Figure 3:
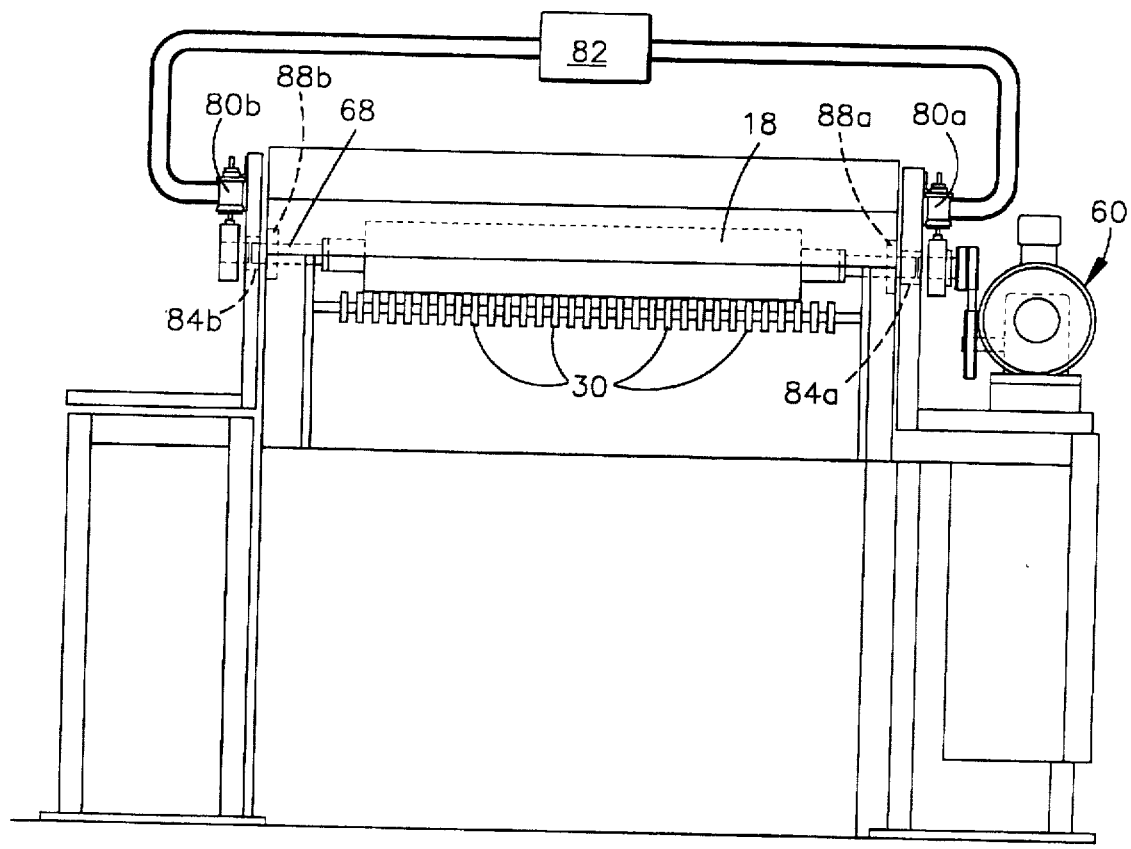
FIG. 3 is an end elevational view of the device of this invention, with parts broken away for clarity.
Figure 6:
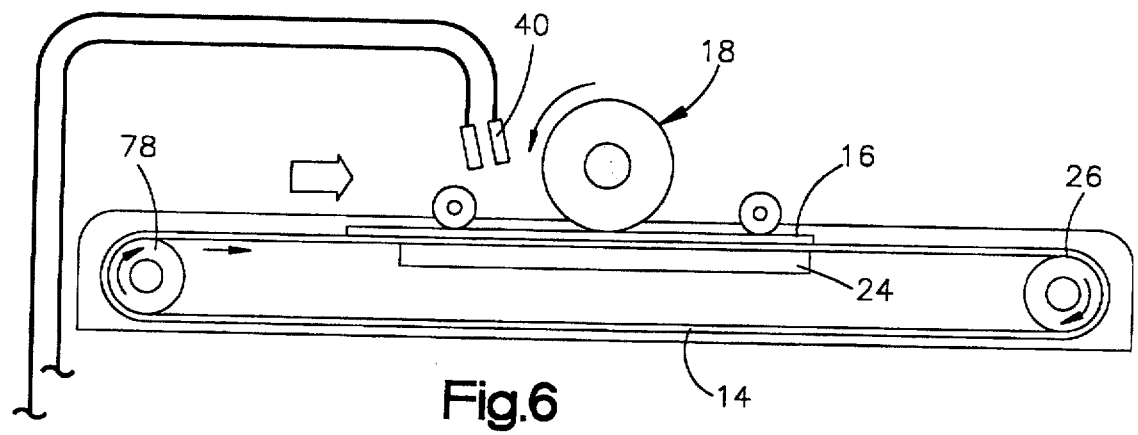
FIG. 6 is a schematic representation of the progress of the workpiece through the device.

Referring now to the drawings, and for the present to FIGS. 1 through 6, a planarizing device according to the present invention is shown. The device includes a work chamber housing, designated generally as 10, defining a work chamber 12 therein. Contained within the work chamber 12 is a conveyor belt 14 to support workpieces, one of which is shown at 16 thereon (FIG. 6). The workpieces will be described in more detail presently. A cylindrical planarizing head 18 is also contained within the work chamber 12 carried by mountings which will be described presently. A pair of pinch rolls 20 and 22 are mounted for rotation on opposite sides of the planarizing head 18 on bearings (not shown), and a pressure plate 24 is mounted below the top surface of the conveyor. A drive roll 26 and an idler roll 28 are provided for driving the conveyor belt 14, the mounting of which will be described presently. Also disposed within the work chamber housing 10 are entrance rollers 30 and exit rollers 32 which are individually driven in a well-known manner to provide for supplying and discharging workpieces to and from the conveyor belt 14. Pinch rolls 34 and 35 may also be provided above the rollers 30 and 32 as shown.

An etchant supply tank 36 is provided which is configured to hold a liquid etchant 37. A pump 38 is connected to the etchant supply tank 36 and to a spray head 40 positioned between the pinch roll 20 and planarizing head 18.

A collection tray 44 is also disposed within the work chamber housing 12 and positioned to collect the unused and spent etchant from the workpieces as they exit the conveyor. The collection tray 44 has a drain 46 which allows the spent etchant to drain either for recovery or for waste disposal. A splash guard 50 surrounds the planarizing head 18 and spray head 40 to prevent splashing and spraying of the etchant.

As can best be seen in FIGS. 2–6, the planarizing head 18 is mounted on a planarizing head mounting designated generally as 60. The planarizing head mounting 60 includes a pair of pivot arms 64a and 64b mounted on opposite sides of the housing 10 on pivot pins 66a and 66b, respectively. Self-aligning bearings (not shown) mount shaft 68 of the planarizing head to one end of each of the pivot arms 64a and 64b. Sheave 70 is mounted on the pivot pins 66a and sheaves 72 is mounted on the end of the shaft 68. Belt 74 connects sheaves 70 and 72. A motor 76 is mounted on one side of the housing 10 and is connected through belt 78 to sheave 70. Therefore, rotation of the motor 76 will cause the belt 78 to drive the sheaves through belts 78 and 74 thus rotating the planarizing head 18.

Pneumatic pressure arm assemblies 80a and 80b are connected respectively to the ends of pivot arms 64a and 64b opposite the ends to which the shaft 68 is attached. Each of the assemblies 80a and 80b is connected to a pneumatic controller 82. The shaft 68 passes through U-shaped openings 84a and 84b on opposite sides of the housing 10, such that movement of the pivot arms 64a and 64b about pivot pins 66a and 66b will allow the shaft 68, and thus the planarizing head 18, to move toward and away from the conveyor belt 14. The mounting of the planarizing head in order to insure it running parallel to the conveyor belt 14 is especially important. In order to seal the U-shaped openings 84a and 84b, disc seals 88a and 88b are mounted on the opposite ends of the shaft 68 adjacent the interior of the U-shaped openings 84a and 84b.

The drive roll 26 is connected to a drive shaft assembly 90, which includes a drive motor 92 and bearings 94a and 94b mounting drive roll shaft 95 on opposite sides of the housing 10. The idler roller 28 is mounted within the work chamber 12 on bearings (not shown).

In operation, the device planarizes workpieces using essentially a chemical etchant without the addition of abrasives thereto.

Figure 7:
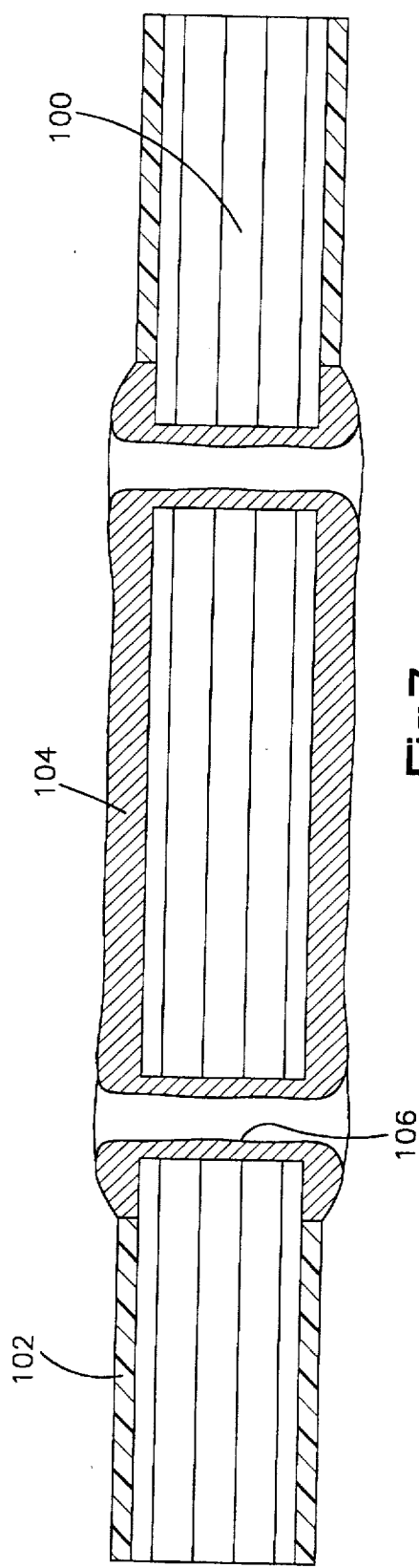
FIG. 7 is a longitudinal, sectional view of a portion of a circuit board to be planarized, shown somewhat schematically.
Figure 8:
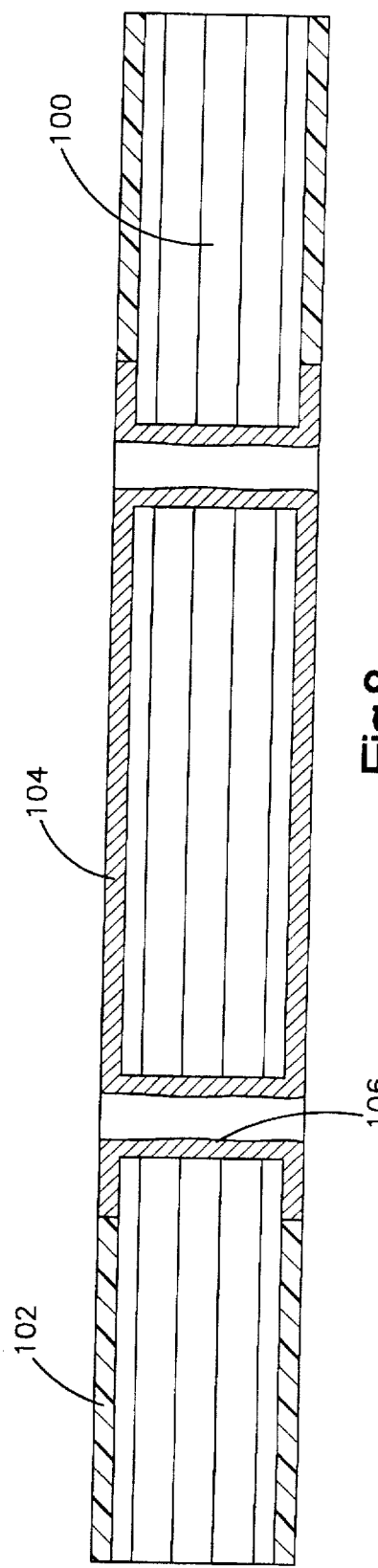
FIG. 8 is a view of the circuit board after having been planarized.

Referring now to FIG. 7, a portion of a circuit board is shown very schematically, processed to a point where planarization is to take place. Such processing is described in co-pending application Ser. No. 08/495,277 and need not be described further. Essentially, the circuit board to be planarized has a substrate 100 on which is deposited photoresist 102 which has been patterned to receive circuitry 104 formed thereon by conventional plating techniques as described therein. The circuitry includes plated through holes 106, extending from one side of the substrate 100 to the opposite side of the substrate. As can be seen in FIG. 7, the top surface of the circuitry 104 is rather irregular (i.e. non-planar) and extends above the top surface of the photoresist 102. The purpose of the planarizing is to remove this excess of metal which extends above the photoresist 102 so as to form a smooth top surface of the circuitry 104 which is essentially flat, smooth and co-planar with the top surface of the photoresist 102 as shown in FIG. 8. To this end, the circuit board as shown in FIG. 7 is passed through the planarizing device, the planarizing head rotating and planarizing etchant applied so as to remove the excess metal extending above the photoresist and resulting in the planarized surface as shown in FIG. 8. This is shown schematically in FIG. 6.

Depending upon how much metal has to be removed, the planarizing may be accomplished in a single step, i.e., a single pass through the planarizing device, or the end result may require multiple passes through the planarizing device. In any event, during each pass, the substrate is fed into the work chamber on rollers 30 to the conveyor 14 where it is passed underneath the pinch roll 20, and the conveyor belt 14 drives the workpieces 16 past the planarizing head 18 which is rotated as shown in FIG. 6. Alternatively, a single pass can result in sufficient metal removal with the machine constructed of multiple planarizing heads, arrayed in succession. Each head is independently mounted and controlled in the same manner as described with respect to the single head. In such a case, a single pass can result in sufficient metal removal.

The conveyor 14 is formed of an etchant-resistant material and preferably has a roughened surface to prevent the rotating planarizing head 18 from moving the workpiece on the conveyor 14. A preferable material for forming the conveyor is polyvinylchloride. The etchant solution 37 is supplied from the tank 36 by pump 38 to spray head 40, where it is applied to the surface of the workpiece 16. In a typical embodiment, the circuitry is formed of copper, and the preferred etchant 37 is cupric chloride and hydrochloric acid as described in the above noted application. It is to be understood that other metals, such as aluminum, can be used to form the circuitry, in which case other etchants, such as hydrochloric acid would be used.

The controller 82 controls the operation of the planarizing head 18 so as to position the planarizing head 18 above the moving conveyor and maintain parallel therewith and exert a downward force on the head 18 into contact with the surface of the workpiece 16. The etchant solution 37 is pumped from the tank 36 by pump 38 to spray head 40 where it is dripped onto the surface of the workpiece causing a chemical reaction to take place to dissolve the raised portion of the metal. The rotating head removes the reaction product as it is formed and brings new solution into contact with the revealed new surface of metal. The spent solution and reaction product are caught in the collection tray 44 and exhausted through the drain 46.

Figure 9:
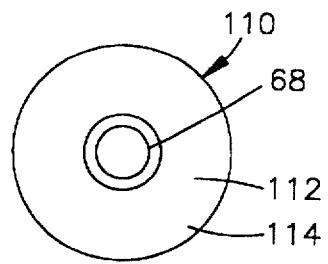
FIG. 9 is a transverse sectional view of one embodiment of a planarizing head according to this invention.

The structure and composition of the planarizing roll are dictated to a large extent by whether a single pass can be used or whether multiple passes are needed to effect planarization. If the planarization can be performed in a single pass with a single head, a roll of the type shown in FIG. 9 is preferred. In this case, the planarizing head is formed of a rubber roller 110 bonded to the shaft 68 which shaft preferably is formed from titanium or other etch-resistant material. The rubber is controlled so as to have a relatively soft interior 112 and a relatively hard exterior 114, the demarcation being indicated by a dotted line. Particularly, the hard outside should have a durometer reading of about 60, whereas the soft interior should have a durometer reading of about 15. However, these values can vary, it being desired that, when the head 18 is urged against the top surface of the workpiece that there be an optimal contact length of about ⅛ of an inch. Thus, the selection of the size and hardness of the rubber, together with the pressure applied by the controller 68, will dictate the parameters so that preferably an approximately ⅛ inch contact length is afforded. In such a case, the planarizing is accomplished without the provision of any type of abrasive in any form.

Figure 10:
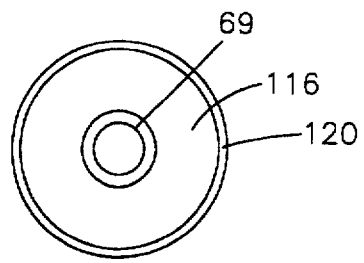
FIG. 10 is a transverse sectional view of another embodiment of a planarizing head according to this invention.
Figure 4:
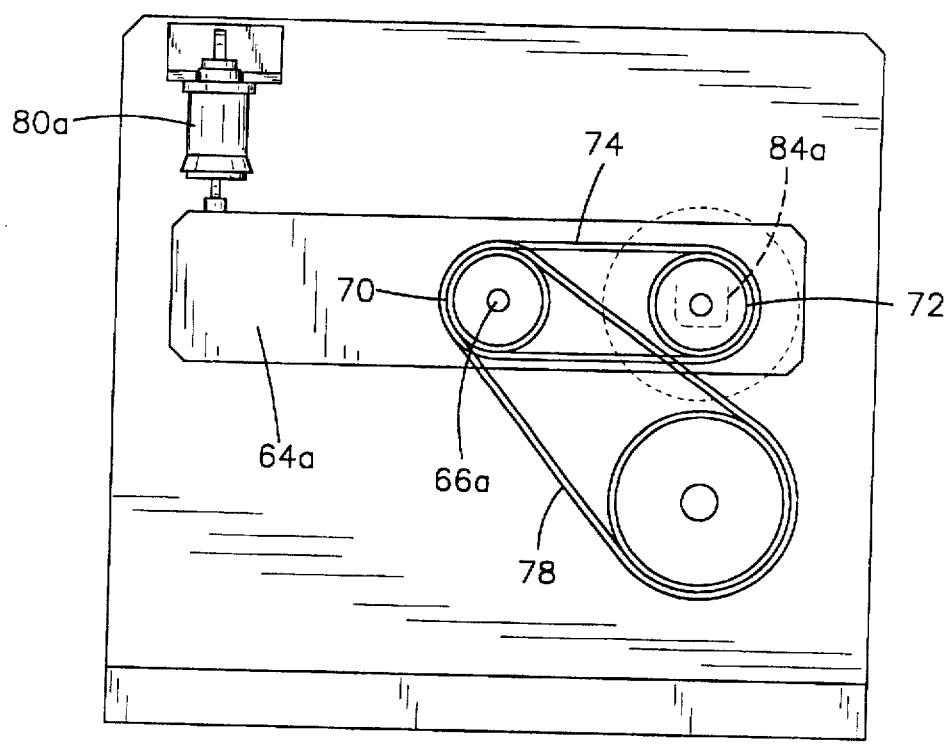
FIG. 4 is a side elevational view of the mounting of one side of the planarizing head according to this invention.
Figure 5:
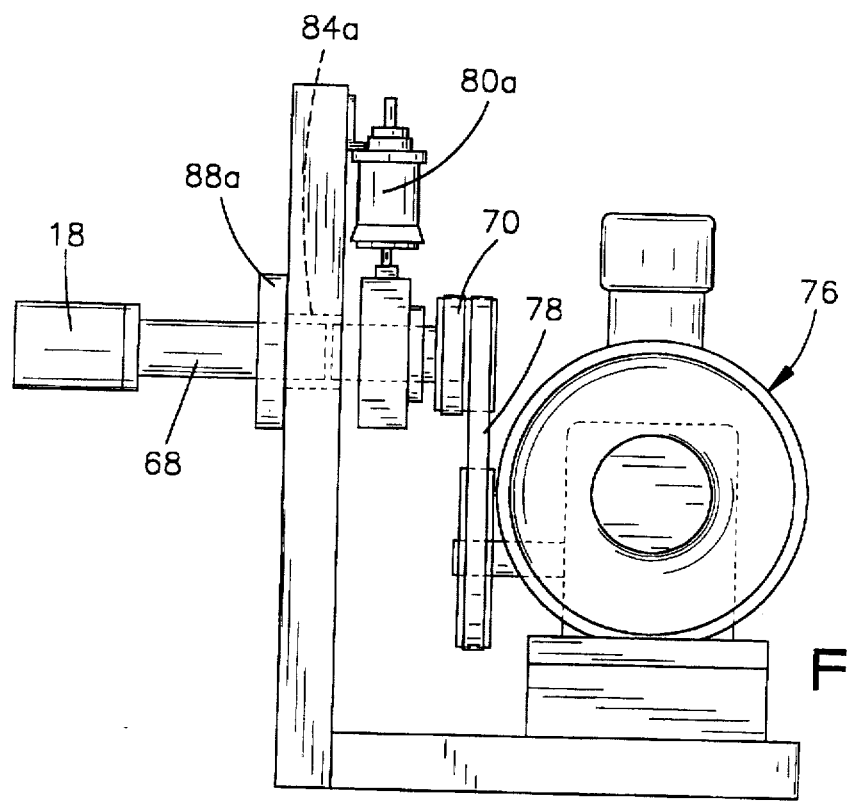
FIG. 5 is an end elevational view of the mounting shown in FIG. 4.

However, if multiple passes are required or multiple heads are employed, it is frequently desirable to use a different type of roll which will speed up the process somewhat during the passes previous to the final pass or final head; and, on the final pass a roll of the type just described can be used. In the initial passes on multiple pass planarizations or on the initial heads of multiple head machines, a roller of the type shown in FIG. 10 is preferred. In this configuration, foam rubber covering 116 is applied over a shaft 69 of PVC tubing, and a polyester film 120 of material having very fine silicon carbide particles embedded therein is applied over the foam rubber 116. The silicon carbide particles are preferably no larger than 15 microns, and can range in size from about 15 microns to about 5 microns. Because of the very soft foam rubber, during the planarization pass the length of contact of the surface of the head 18 with the substrate is optimally about 1 inch. Thus, for multiple passes or in multiple head devices, some increase in metal removal can be achieved by the abrasive in the roll, although the abrasive is extremely fine and the abrasive is not added to the etchant. Also, the 1 inch of head contact speeds up the process. However even this abrasive can leave some slight scratching. Therefore, where a significant amount of material must be removed, multiple passes are performed or a machine with multiple heads is utilized, with all but the last pass or head preferably being a roll of the type described with respect to FIG. 9, whereas the final pass or last head is a roll of the type described in FIG. 10 to assure a final product in which the metal 104 is essentially flat, smooth and coplanar with the photo resist 102 as shown in FIG. 8.

Accordingly, the preferred embodiments of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of chemically planarizing an exposed surface of metal on a substrate to a pre-determined thickness comprising the steps of;
   a) providing a substrate having an exposed metal surface thereon to be planarized;
   b) providing a planarizing head;
   c) continuously moving said planarizing head, with the planarizing head in contact with said exposed metal surface;
   d) moving said substrate past said planarizing head;
   e) continuously supplying a chemical etchant essentially free of abrasive material to the interface between the exposed metal surface and the planarizing head; and
   f) determining when said metal has reached said pre-determined thickness.

2. The invention as defined in claim 1 wherein said planarizing head is rotated with respect to said metal surface.

3. The invention as defined in claim 2 wherein said planarizing head is a roller which is rotated in contact with the metal surface.

4. The invention as defined in claim 1 wherein said metal is copper and said etchant comprises cupric chloride and hydrochloric acid.

5. The invention as defined in claim 4 wherein said substrate is a dielectric material having copper circuitry thereon.

6. The invention as defined in claim 5 wherein said copper circuitry is surrounded by a dielectric material, above which said circuitry extends initially, and wherein said planarization is completed when the upper surface of said copper circuitry is substantially co-planar with said surrounding dielectric material.

7. The invention as defined in claim 6, further characterized by said substrate having through holes therein with copper plated inset holes.

8. The method of claim 1, wherein a predetermined pressure is applied to the planarizing head against said metal on the substrate.

9. The method of claim 1 wherein said support member comprises a conveyor which moves said substrate with respect to said planarizing head.

10. The invention as defined in claim 1 wherein steps (c), (d) and (e) are performed at least twice.

11. The invention as defined in claim 10 wherein on the final iteration of steps (c), (d) and (e), the surface of the planarizing head is formed of a material essentially free of abrasive material.

12. The invention as defined in claim 11 wherein on at least one iteration before the final iteration, the surface of the planarizing head is provided with cloth having particles of 15 microns or less embedded therein.

13. The invention as defined in claim 10 wherein the said steps (c), (d) and (e) in at least two situations are performed on successive planarizing heads in a single pass.

14. Apparatus for chemically planarizing a metal surface on a substrate comprising;
   a work chamber;
   a planarizing head disposed in said work chamber;
   a conveyor disposed in said chamber and configured to support substrates having metal surfaces thereon;
   a drive mechanism to move said conveyor;
   an operating mechanism to rotate said planarizing head;
   a positioning mechanism to position said planarizing head with respect to said conveyor, including a controller to supply a predetermined position to said planarizing head against said substrate:
   etchant supply for supplying etchant for use by said planarizing head; and
   seals to maintain said etchant within the work chamber, whereby
   substrates can be moved through said work chamber in contact with the rotating planarizing head to effect planarization of the metal surface.

15. The invention as defined in claim 14 wherein said planarizing head comprises a rotating cylindrical member.

16. The invention as defined in claim 15, further characterized by a mounting mechanism for the rotating head to maintain the rotating head essentially parallel to the surface of the substrate.

17. The invention as defined in claim 16 wherein said planarizing head is carried by a pair of pivot arms located on opposite sides of said work chamber.

18. The invention as defined in claim 14 wherein said conveyor includes a surface configuration to resist slippage of the substrates thereon.

19. The invention as defined in claim 18 wherein the surface configuration includes a high friction surface material.

20. The invention as defined in claim 14 further characterized by a pressure plate supporting said conveyor and at least one pressure roll positioned to bias the substrate against the conveyor.

21. The invention as defined in claim 14 wherein the surface of the planarizing head is formed of a material essentially free of abrasive material.

22. The invention as defined in claim 21 wherein said material is rubber.

23. The invention as defined in claim 14 wherein said planarizing head includes an outer surface comprised of a cloth having particles no greater than 15 microns impregnated therein.

24. The invention as defined in claim 14 wherein there are a plurality of planarizing heads arrayed to contact the work surface as it moves on the conveyor.

* * * * *